(12) United States Patent
Woo et al.

(10) Patent No.: US 10,474,207 B2
(45) Date of Patent: Nov. 12, 2019

(54) CARBON FIBER LAMINATE PIEZOELECTRIC COOLER AND METHOD THEREFOR

(71) Applicant: DELL PRODUCTS, LP, Round Rock, TX (US)

(72) Inventors: Joohyun Woo, Austin, TX (US); Deeder M. Aurongzeb, Austin, TX (US)

(73) Assignee: DELL PRODUCTS, LP, Round Rock, TX (US)

( * ) Notice: Subject to any disclaimer, the term of this patent is extended or adjusted under 35 U.S.C. 154(b) by 1 day.

(21) Appl. No.: 15/242,167

(22) Filed: Aug. 19, 2016

(65) Prior Publication Data

US 2016/0357230 A1 Dec. 8, 2016

Related U.S. Application Data

(63) Continuation of application No. 14/460,974, filed on Aug. 15, 2014, now Pat. No. 9,422,944.

(51) Int. Cl.
*G06F 1/20* (2006.01)
*F04D 33/00* (2006.01)
(Continued)

(52) U.S. Cl.
CPC ............ *G06F 1/203* (2013.01); *F04D 33/00* (2013.01); *G01K 13/00* (2013.01); *G06F 1/206* (2013.01); *G06F 1/26* (2013.01); *G06F 11/327* (2013.01); *H01L 23/467* (2013.01); *H01L 2924/0002* (2013.01)

(58) Field of Classification Search
CPC ... H01L 41/094; H01L 41/042; H01L 41/083; H01L 41/053; H01L 41/08; H01L 41/1136; F21V 29/40; F21V 29/74; F21V 29/004; H05K 1/0203; H05K 7/20963; H05K 1/182; H05K 2201/10219; H05K 7/20409; G06F 1/20; G06F 1/206; G06F 1/181; G06F 2200/203; F04B 39/08; F04B 43/046; H04R 17/005; H04R 31/00
See application file for complete search history.

(56) References Cited

U.S. PATENT DOCUMENTS 4,363,993 A     12/1982  Nishigaki et al.
4,498,851 A  *  2/1985  Kolm .................... F04D 33/00
                                                    310/331

(Continued)

OTHER PUBLICATIONS

"Global Data Center Cooling Solutions Market," PR Newswire Research and Markets, Dublin, Mar. 19, 2014, http://www.prnewswire.com/news-releases/global-data-center-cooling-solutions-market-250921641.html.

*Primary Examiner* — James Wu
*Assistant Examiner* — Michael A Matey
(74) *Attorney, Agent, or Firm* — Larson Newman, LLP

(57) ABSTRACT

An opening at a first carbon fiber sheet is provided, the opening extending through the sheet from a first major surface to a second major surface, the opening defining two sides and a first end of a rectangular flap, a second end of the flap remaining rooted in the first carbon fiber sheet. A piezoelectric transducer is bonded to the first carbon fiber sheet, the transducer proximate to the second end of the flap. A controller including a signal generator is coupled to the piezoelectric transducer, the piezoelectric transducer to excite sympathetic vibration of the flap.

20 Claims, 10 Drawing Sheets

(51) Int. Cl.
  *G01K 13/00* (2006.01)
  *G06F 1/26* (2006.01)
  *H01L 23/467* (2006.01)
  *G06F 11/32* (2006.01)

(56) References Cited

U.S. PATENT DOCUMENTS

| | | | | |
|---|---|---|---|---|
| 4,923,000 A * | 5/1990 | Nelson | | F04D 33/00 |
| | | | | 165/122 |
| 5,008,582 A * | 4/1991 | Tanuma | | H01L 23/467 |
| | | | | 257/E23.099 |
| 5,111,278 A * | 5/1992 | Eichelberger | | H01L 23/473 |
| | | | | 257/698 |
| 5,408,376 A | 4/1995 | Nishikura et al. | | |
| 5,558,156 A * | 9/1996 | Tsutsui | | F28F 1/325 |
| | | | | 165/122 |
| 5,861,703 A | 1/1999 | Losinski | | |
| 5,869,189 A | 2/1999 | Hagood, IV et al. | | |
| 5,939,632 A | 8/1999 | Moore et al. | | |
| 5,990,618 A * | 11/1999 | Morita | | H05K 7/20963 |
| | | | | 313/46 |
| 6,098,460 A | 8/2000 | Otsuchi et al. | | |
| 6,334,480 B1 * | 1/2002 | Lim | | F28F 13/02 |
| | | | | 165/80.3 |
| 6,624,550 B2 | 9/2003 | Biesenecker et al. | | |
| 6,703,766 B2 | 3/2004 | Duerr | | |
| 6,713,942 B2 | 3/2004 | Raman et al. | | |
| 6,747,400 B2 | 6/2004 | Maichl et al. | | |
| 7,147,079 B2 * | 12/2006 | Brun | | B60H 1/00357 |
| | | | | 165/84 |
| 7,183,697 B2 * | 2/2007 | Yonetake | | H01L 41/094 |
| | | | | 310/330 |
| 7,321,184 B2 * | 1/2008 | Lee | | H05K 7/20172 |
| | | | | 310/328 |
| 7,742,299 B2 | 6/2010 | Sauciuc et al. | | |
| 7,919,905 B2 | 4/2011 | Abe | | |
| 8,022,601 B2 | 9/2011 | Stollberg | | |
| 8,138,034 B2 | 3/2012 | Han et al. | | |
| 8,415,859 B2 * | 4/2013 | Lee | | H02N 2/18 |
| | | | | 290/1 R |
| 8,556,227 B2 | 10/2013 | Buestgens et al. | | |
| 8,725,458 B2 * | 5/2014 | Landers, Jr. | | H01L 23/34 |
| | | | | 257/717 |
| 2003/0222341 A1 | 12/2003 | Oberhardt et al. | | |
| 2004/0223302 A1 * | 11/2004 | Pokharna | | H05K 7/20318 |
| | | | | 361/700 |
| 2006/0138905 A1 | 6/2006 | Gonzales et al. | | |
| 2006/0162331 A1 | 7/2006 | Kirkpatirck | | |
| 2006/0192465 A1 * | 8/2006 | Kornbluh | | B64C 3/48 |
| | | | | 310/309 |
| 2007/0001550 A1 | 1/2007 | Palanduz et al. | | |
| 2008/0061429 A1 * | 3/2008 | Cohen | | B01L 7/52 |
| | | | | 257/706 |
| 2009/0279255 A1 | 11/2009 | Sauciuc et al. | | |
| 2011/0120679 A1 * | 5/2011 | Tanaka | | F04D 33/00 |
| | | | | 165/121 |
| 2012/0298165 A1 * | 11/2012 | Kurihara | | H01L 35/32 |
| | | | | 136/230 |
| 2013/0037245 A1 * | 2/2013 | Tanida | | F04D 33/00 |
| | | | | 165/121 |
| 2013/0243030 A1 | 9/2013 | Mahalingam et al. | | |
| 2013/0301218 A1 * | 11/2013 | Li | | F04D 33/00 |
| | | | | 361/695 |
| 2014/0021848 A1 * | 1/2014 | Simon | | F21V 23/009 |
| | | | | 313/35 |
| 2014/0210325 A1 | 7/2014 | Aurongzeb et al. | | |
| 2014/0352427 A1 | 12/2014 | Dreyer et al. | | |

* cited by examiner

CARBON FIBER LAMINATE PIEZOELECTRIC COOLER AND METHOD THEREFOR

CROSS-REFERENCE TO RELATED APPLICATION

This application is a continuation of U.S. patent application Ser. No. 14/460,974, entitled "Carbon Fiber Laminate Piezoelectric Cooler and Method Therefor," filed on Aug. 15, 2014, the disclosure of which is hereby expressly incorporated by reference in its entirety.

FIELD OF THE DISCLOSURE

This disclosure generally relates to information handling systems, and more particularly relates to carbon fiber laminate piezoelectric coolers at an information handling system.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

Figure 1:
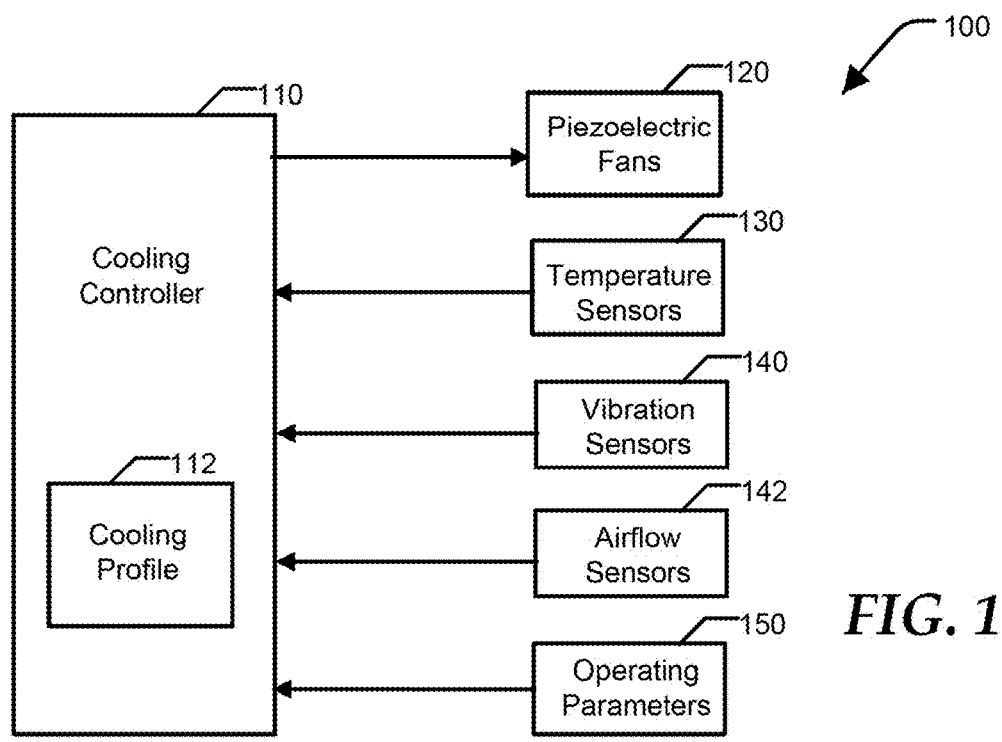
FIG. 1 is a block diagram illustrating a cooling system of an information handling system according to a specific embodiment of the present disclosure.

The following description in combination with the Figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings may be utilized in this application, as well as in other applications and with several different types of architectures such as distributed computing architectures, client or server architectures, or middleware server architectures and associated components.

Information handling systems generate heat during operation. Heat can be dissipated from the system using active, passive or a combination of active and passive cooling techniques. Passive cooling systems can include heat sinks, heat pipes, and other structures that conduct heat away from a system components that generates heat, such as a central processing unit (CPU), a graphics processing unit (GPU), and other modules that together make up an information handling system. Active cooling systems generally include a fan for drawing in cooler air from outside the system and exhausting warmer air from inside the system. Increasing miniaturization of information handling systems necessitates advanced cooling solutions. Disclosed herein are techniques for fabricating piezoelectric cooling devices using portions of the enclosure of the information handling system. For example, a portion of a carbon fiber laminate chassis can be made to sympathetically vibrate in response to stimulus from a piezoelectric transducer. In one embodiment, a portion of a carbon fiber laminate layer can be machined to provide a cantilevered flap, which can be excited to vibrate by vibrations generated by a piezoelectric transducer proximate to the flap. These flap structures can be distributed within an information handling system, such as adjacent to a heat-producing device, to circulate air away from the device and to prevent areas of stalled air flow.

In another embodiment, a plurality of piezoelectric cooling elements can be selectively enabled and disabled based on a stored cooling profile. For example, a cooling profile can be determined during operation of an information handling system and the profile can be updated as necessary based on variations of predetermined operating characteristics. A cooling system can utilize the generated cooling profile to appropriately configure the cooling system based on various operating parameters of the system. For example, a cooling profile can specify that piezoelectric cooling elements in the vicinity of a graphics processing device should be energized in response to initiating execution of a particular game application. Other operating parameters identified in the cooling profile can include power consumption at various system components, ambient temperature, device driver configurations, overclocking, and the like. The cooling profile can be updated, for example adapting to changing operating parameters and new software applications.

In still another embodiment, piezoelectric transducers can be used to excite sympathetic vibration of other chassis structures to induce air movement. For example, fins included at an exhaust vent or at a heat sink component can be made to sympathetically vibrate in response to an adjacent piezoelectric transducer. For another example, piezoelectric transducers can be used to excite resonant vibration in substantial portions of a chassis panel or enclosure panel to redistribute air within an information handling system and thereby minimize the size and magnitude of localized heated air. The techniques described above can be better understood with reference to FIGS. 1-14.

FIG. 1 shows a cooling system 100 of an information handling system according to a specific embodiment of the present disclosure. For example, the information handling system can be a lap-top computer, a tablet computer, or another type of system that includes active cooling technology. Cooling system 100 includes a cooling controller 110, one or more piezoelectric fans 120, one or more temperature sensors 130, one or more vibration sensors 140, and one or more airflow sensors 142. The cooling controller can receive operating parameters 150 that can be utilized by the cooling controller 110 to regulate operation of the piezoelectric fans 120. The cooling controller includes a cooling profile 112. Cooling controller 110 can utilize information provided by cooling profile 112 to specify an initial cooling configuration of controller 110. In addition, the cooling profile 112 can adapt to changes in operating conditions at the system, and thereby modify operation of cooling controller 110.

Cooling controller 110 is configured to control operation of piezoelectric fans 120 and other devices and circuitry that can affect thermal characteristics of an information handling system. For example, cooling system 100 can control execution of software applications, processor clock frequency, and the like. Cooling controller 110 can be responsive to temperature information received form temperature sensors 130. Temperature sensors 130 can include one or more discrete temperature sensing devices located with the information handling system, and temperature sensing components that are integrated within semiconductor devices and other system components. For example, a central processing unit (CPU) and other integrated circuit devices typically include temperature sensors that can provide operating temperature information to the cooling controller 110. Cooling controller 110 can utilize information provided by vibration sensors 140 and airflow sensors 142 to regulate operation of cooling system 100. For example, vibration sensors 140 can identify when a piezoelectric fan is operating efficiently, such as at an optimal resonant frequency. Airflow sensors 142 can include a micro-electro-mechanical system (MEMS) airflow sensor.

Operating parameters 150 can include information provided by device drivers associated with devices installed at the information handling system, power consumption at one or more system components, the identity and operating status of software applications that are being executed by the system, and the like. The cooling profile 112 can include a lookup table providing specific cooling configurations based on a collection of operating parameters as well as algorithms to adapt and update the cooling profile based on the operating parameters 150 as they change over time. A cooling configuration can include individual operating settings for each piezoelectric fan distributed throughout the system. The adaptive behavior provided by cooling profile 112 can be referred to as a learning process. For example, the cooling controller can update the cooling profile in response to determining a cooling configuration that is optimal for operation of a new application program installed at the information handling system.

While FIG. 1 illustrates the use of piezoelectric fans 120, many of the features and techniques described herein are applicable to other cooling devices, including rotating fans, pump-actuated liquid cooling systems, radiators, and the like. However, the piezoelectric fans disclosed herein are especially well suited for compact systems such as notebook computers, tablet computers, mobile communications devices, and the like. Piezoelectric fans 120 include a mechanical element that is excited to vibrate by a piezoelectric transducer that is closely coupled to the mechanical element. Cooling controller 110 can include a tunable oscillator that provides a signal to the piezoelectric transducer. Cooling controller 110 can adjust the frequency of the oscillator to maximize air movement generated by the mechanical element. For example, maximum air movement is typically achieved when the frequency of the oscillator is adjusted to bring the mechanical element to a state of sympathetic resonance. The ideal frequency to achieve resonance depends on the dimensions of the mechanical element, the material from which the mechanical element is fabricated, and other parameters. Optimal performance of the piezoelectric fan can be determined based on feedback received from temperatures sensors 130, vibration sensors 140, airflow sensors 142, signals received from the piezoelectric transducer, or the like. All of these aspects are described in detail below.

Figure 2:
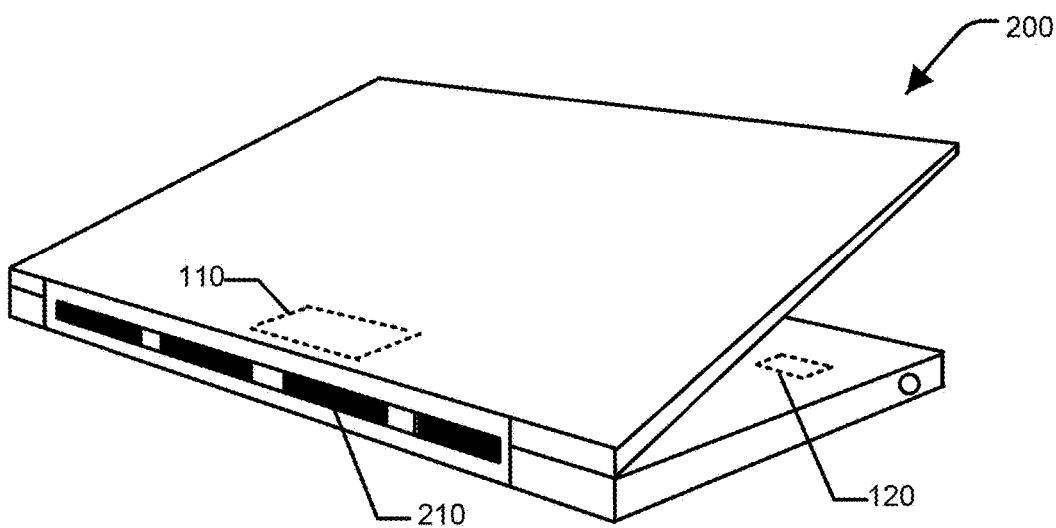
FIG. 2 is a perspective diagram illustrating an information handling system according to an embodiment of the present disclosure.

FIG. 2 shows an information handling system 200 according to an embodiment of the present disclosure. The information handling system 200 includes a cooling controller 110 and a plurality of piezoelectric fans distributed at locations inside the information handling system, including an exemplary piezoelectric fan 120. The other components of cooling system 100 are not shown, for clarity. Information handling system 200 optionally includes one or more air intake and exhaust vents, such as exhaust vent 210. In one embodiment, the information handling system includes no intake or exhaust vents. For example, piezoelectric fans distributed inside the information handling system can move warm air away from heat sources, allowing passive thermal radiation to dissipate the heat out of the system. In another embodiment, vent fins included at the exhaust vent 210 can be excited to vibrate by a nearby piezoelectric transducer, the vibration causing movement of air proximate to the vent and increasing the exhaust of warm air from the interior of the information handling system 200.

Information handling system 200 includes an enclosure and other chassis components. In an embodiment, significant portions of the enclosure can include a laminated carbon fiber composite. For example, the enclosure can include a plurality of carbon fiber sheets bonded together. The carbon fiber layers can include unidirectional carbon fibers, carbon fibers that are woven orthogonally, or other fiber variations. A particular layup fiber material can be selected for different portions of the enclosure or chassis components to achieve a desired stiffness characteristic, durability, aesthetic quality, and the like. As disclosed herein, an inner-most layer of carbon fiber of the composite layup can be machined or otherwise processed to include a vibrating element of a piezoelectric fan. Accordingly, physical and chemical characteristics of this carbon fiber layer can be selected based on the utility of the material for serving this purpose. For example, fiber orientation, binding resin, laminate thickness, and other characteristics can be selected to increase the durability and resonant characteristics of the vibrating element, and other desired qualities. For other embodiments, the enclosure can include metal, thermoplastic, another material, or a combination of materials.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network server or storage device, a switch router, wireless router, or other network communication device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communications between the various hardware components.

Figure 3:
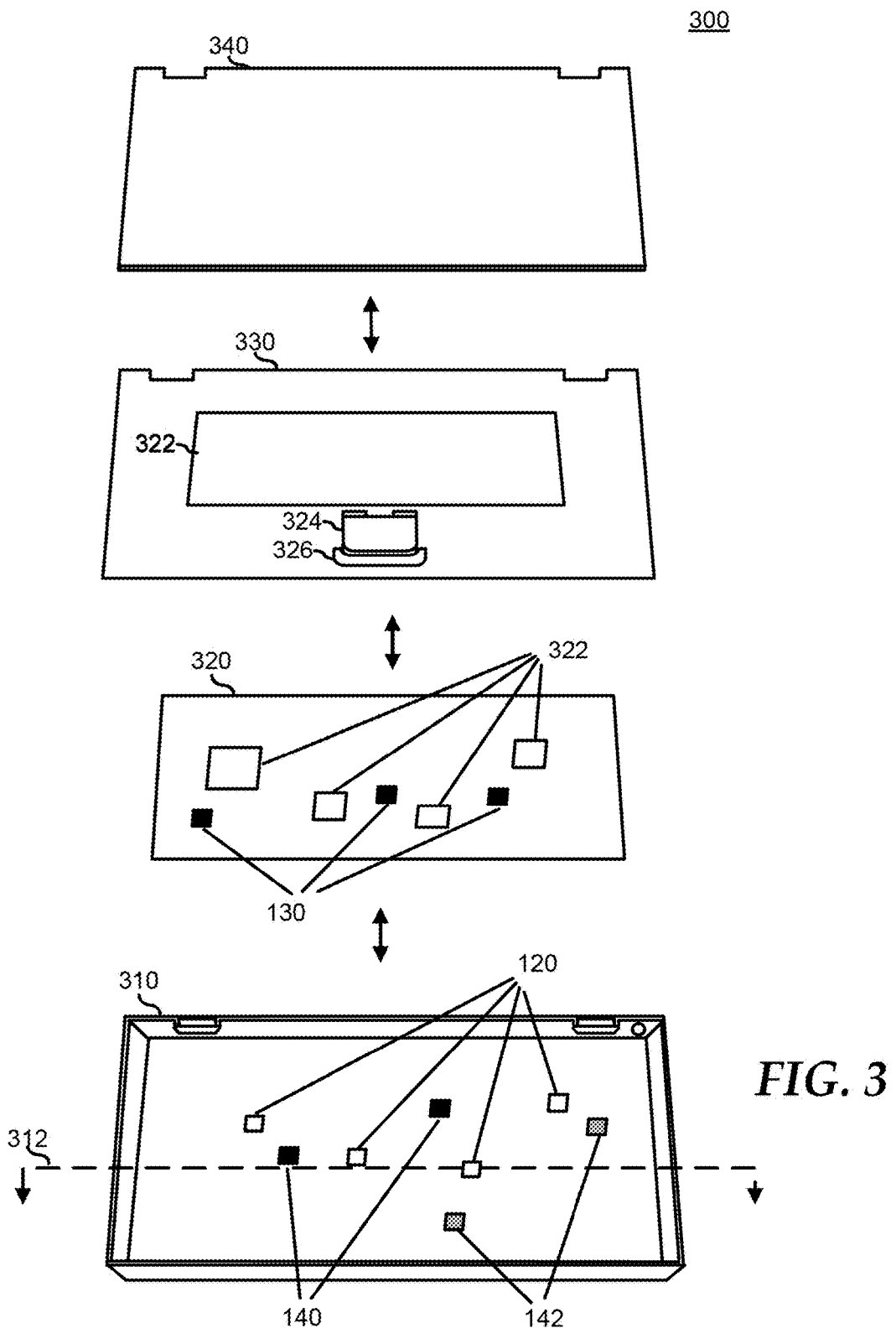
FIG. 3 illustrates enclosure and chassis components of the information handling system of FIG. 2 according to a specific embodiment of the present disclosure.

FIG. 3 illustrates enclosure and chassis components 300 of the information handling system 200 of FIG. 2, including an enclosure bottom 310, a printed circuit board assembly 320, an intermediate chassis component 330, and an enclosure top 340. The components 310, 320, 330, and 340 can be stacked one atop another as shown by the arrows. Enclosure bottom 310 provides fastening locations for mounting the printed circuit board 320 and other mechanisms. The enclosure and chassis components can include various openings to accommodate sockets, connectors, display devices, access panels, and the like. The intermediate chassis component 330 can provides fastening locations for attaching the intermediate chassis component 330 to the enclosure bottom 310. The intermediate chassis component 330 can includes a keyboard opening 322, a touchpad device opening 324, and a function button opening 326, and the like. Enclosure top 340 can provide fastening locations for a display and includes features to facilitate attaching the enclosure top 340 to the enclosure bottom 310. The techniques disclosed herein are illustrated with respect to the enclosure bottom 310, but are equally applicable to any laminated component included in an information handling system. A cross sectional indicator 312 is shown corresponding to the enclosure bottom 310, and is described below with reference to FIGS. 4-8.

The printed circuit board 320 can include a plurality of electronic components 322, such as a central processing unit, chip sets, embedded controllers, graphic processing units, network interfaces, and the like. The printed circuit board 320 also can include one or more discrete temperature sensors 130, in addition to temperature sensors that may be integrated within one or more of electronic components 322. The enclosure bottom 310 can include a plurality of piezoelectric fans 120, one or more vibration sensors 140, and one or more airflow sensors 142. While the piezoelectric fans 120, vibration sensors 140, and airflow sensors 142 are shown associated with the enclosure bottom 310, each may be associated with the intermediate chassis component 330, the printed circuit board 320, the enclosure top 340, or with another chassis component, not shown at FIG. 3.

In an embodiment of the present disclosure, the piezoelectric fans 120 are fabricated, in part, from a layer of carbon fiber included in a stack of laminated carbon fiber sheets, as described below in detail. In another embodiment, the piezoelectric fans 120 can include discrete components attached to the enclosure bottom 310, the printed circuit board 320, the intermediate chassis component 330, or at another component. During operation of the information handling system 200, the piezoelectric fans 120 are configured to move air from one inside portion of the system 200 to another portion. For example, a piezoelectric fan 120 can be located in proximity to a corresponding electronic component 322 so as to move air, heated by the electronic component, away from the vicinity of the component.

Figure 4:
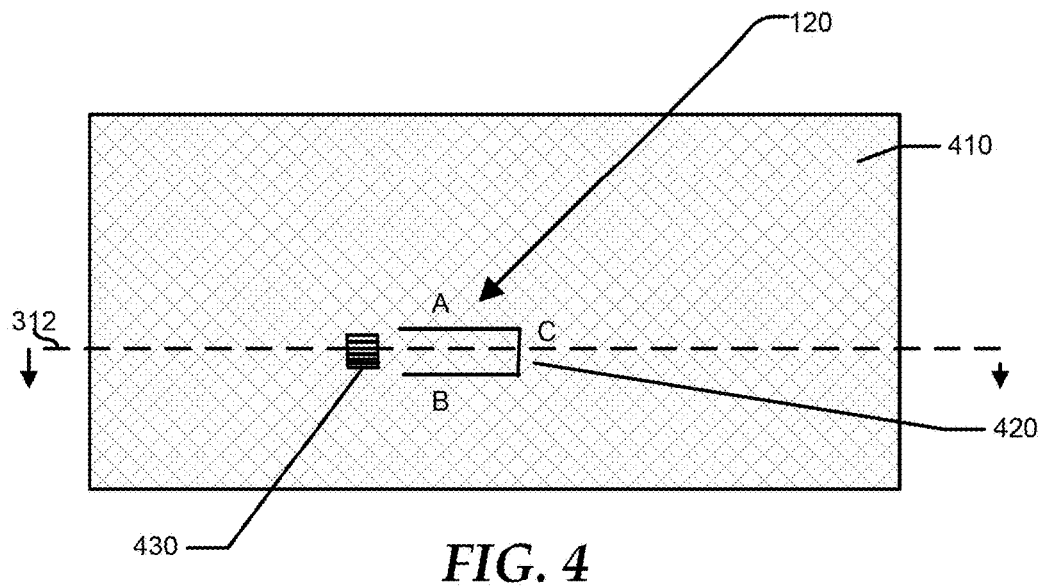
FIG. 4 is a top-down view of a portion of the enclosure bottom of FIG. 3 according to a specific embodiment of the present disclosure.

FIG. 4 is a top-down view of a portion of the enclosure bottom 310 of FIG. 3 according to a specific embodiment of the present disclosure. The enclosure bottom 310 includes a stack of carbon fiber sheets, including a carbon fiber sheet 410. The cross sectional indicator 312 of FIG. 3 is shown. A piezoelectric fan 120 is illustrated, including a vibrating element 420 and a piezoelectric transducer 430. The features of the vibrating element 420 are described below with reference to FIGS. 5-8. The vibrating element 420 includes a first side, reference A, a second side, reference B, a free end, reference C, and a root end adjacent to the piezoelectric transducer 430. It will be appreciated that the portion of carbon fiber sheet 410 has been highly magnified so as to better view the features of the piezoelectric fan 120.

Figure 5:
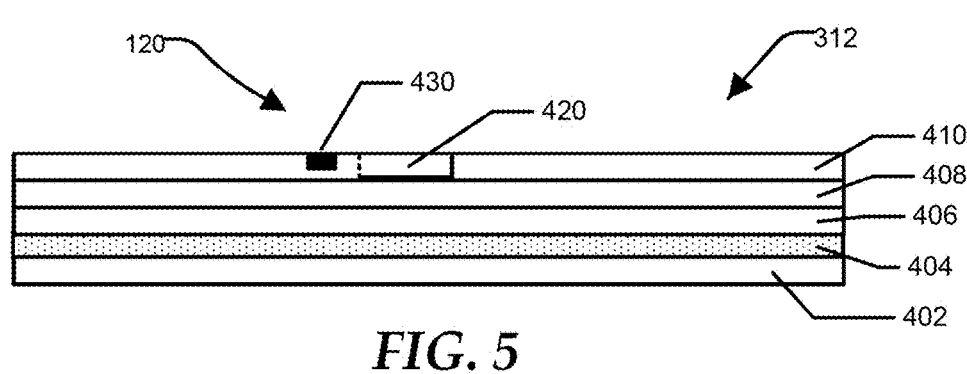
FIG. 5 is a cross sectional view of the enclosure bottom of FIG. 3 according to a specific embodiment of the present disclosure.
Figure 6:
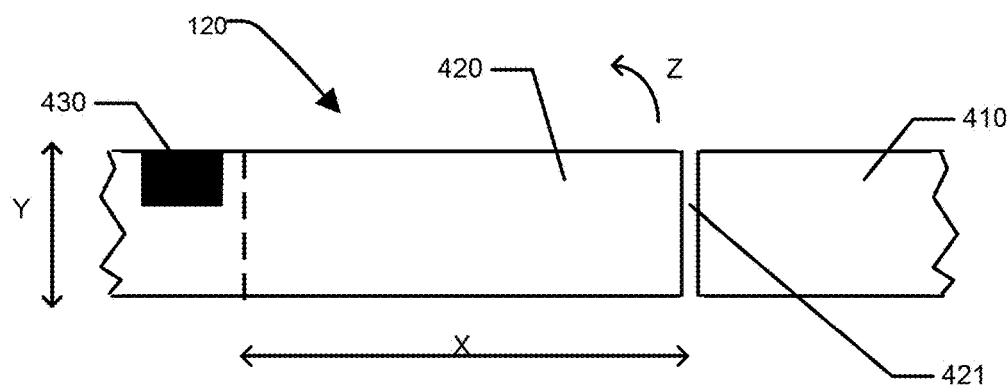
FIG. 6 is an enlarged view of the vibrating element shown in FIG. 5.

FIG. 5 is a cross sectional view of the enclosure bottom 310 along cross section reference 312, according to a specific embodiment of the present disclosure. The cross section 312 shows a stack of sheet material, including sheet 402, 404, 406, 408, and the carbon fiber sheet 410 of FIG. 4. In one embodiment, the vibrating element 420 is formed in carbon fiber sheet 410 prior to laminating sheet 410 to sheets 402-408. FIG. 6 shows a magnified view of the vibrating element shown at FIG. 5. According to the embodiment of FIGS. 5 and 6, the vibrating element can be provided by milling an opening fully penetrating carbon fiber sheet 410, the opening corresponding to sides A and B, and end C of FIG. 4. For example, a sawing or milling tool can render cuts that extend from the top major surface of sheet 410 to the bottom major surface of sheet 410 along the lines A, B, and C, providing a cantilever structure that is free from the remainder of sheet 410 at sides A and B, and at end C, but remains rooted at the remaining end adjacent to the piezoelectric transducer 430. The vibrating element 420 can be referred to as a flap, in part because the movement of the element in response to excitation by piezoelectric transducer 430 can be described as flapping. In this embodiment, the entirety of the opening, including sides A and B, and end C, is made perpendicular to the major surfaces of sheet 410. The portion of the opening corresponding to the end C is identified by reference 421 at FIG. 6.

As shown at FIG. 6, carbon fiber sheet 410 has a thickness indicated by reference Y, and the length of the vibrating element indicated by reference X. The width of the vibrating element corresponds to reference C of FIG. 4. In one embodiment, the thickness of carbon fiber sheet 410, and therefore the thickness of the vibrating element 420, Y, can be 0.15 millimeters. The length of the vibrating element 420, X, can be five millimeters, and the width, C, can be two millimeters. Each of these dimensions can vary considerably without deviating from the scope of the present disclosure, though the length dimension is typically greater than the width dimension. The dimensions of the vibrating element 420 can determine the resonant characteristics of the element. Accordingly, the frequency of oscillation of the signal provided to piezoelectric transducer 430 can depend, in part, on the dimensions of the vibrating element 430.

The operating frequency can be established based on the principles of a feedback control system, wherein the frequency of the signal applied to the piezoelectric transducer 430 is optimized based on feedback received from thermal sensors 130, vibration sensors 140, airflow sensors 142, the piezoelectric transducer 430, or the like. In one embodiment, the frequency of operation can be between twenty and thirty kilohertz. In another embodiment, the frequency can be periodically varied, for example repeatedly ramping the frequency from one frequency to another over a period of time. For example, the frequency can be repeatedly ramped from 25 KHz to 26 KHz every one second. One of skill will appreciate that the frequencies provided are only examples, and that an optimal frequency of operation can vary considerably based on dimensions of the vibrating elements and physical characteristics of the carbon fiber material. For example, an optimal frequency may be lower or higher than described above, such as in the range of 15 KHz to 45 KHz.

One or more sheets of sheets 402-410 can include prepregnated (prepreg) fiber materials. The prepregnated fiber materials can be placed in a mould, during which time the materials cure to form the desired shape of the bottom enclosure. A prepreg fiber material can include a layer of carbon fiber material to which a matrix material has been applied. The carbon fiber material can include strands of carbon fiber, a woven fabric of the fiber material, or a combination thereof. The matrix material substantially fills all voids between individual fibers of the fiber material. In a particular embodiment, the matrix material includes a polymer or resin matrix material, and can be a thermoplastic matrix or a thermosetting matrix material. For example, the matrix material can include an epoxy resin, a phenolic resin, polyester resin, vinyl ester resin, another matrix material, or a combination thereof. The fiber materials can include glass fiber, carbon fiber, aramid fiber, natural fiber, or another type of fiber that is prepregnated with the matrix material. The skilled artisan will recognize that there are several methods of prepregnating the fiber material, including a hot melt prepregnation process, a solvent dip prepregnation process, another prepregnation process, or a combination thereof. The moulding process can include a vacuum bag or pressure bag moulding process, a press moulding process, another moulding process, or a combination thereof, as needed or desired.

The laminating process is configured to ensure that the bottom of the vibrating element 420 that is adjacent to sheet 408 is not bonded to sheet 408. Accordingly, the vibrating element is free to flex in a small arc, away from sheet 408 in response to vibration of piezoelectric transducer 430, illustrated by reference Z. The piezoelectric transducer 430, shown at FIGS. 4-6, can be embedded in an indentation milled into sheet 410, or otherwise bonded securely to sheet 410 proximate to the root end of vibrating element 420. During operation, an oscillatory signal is applied to input leads of the piezoelectric element causing the element to vibrate. This vibration is communicated through portions of sheet 410 in the vicinity of vibrating element 420, causing the element 420 to sympathetically vibrate. The frequency of the signal applied to piezoelectric transducer 430 can be adjusted to cause optimal vibration of element 420, the optimal frequency referred to herein as the resonant frequency.

In one embodiment, one or more of sheets 402-408 can include a material selected to dampen transmission of vibrations from inside the information handling system 200 to the exterior of the enclosure. For example, sheet 404 of FIG. 5 can include a material having elastic properties, such as thermoplastic material. Vibrations from the vibrating element 420 or from other internal devices can be substantially absorbed by sheet 404 so that a user of the system 200 does not sense the vibration while holding the system.

Figure 7:
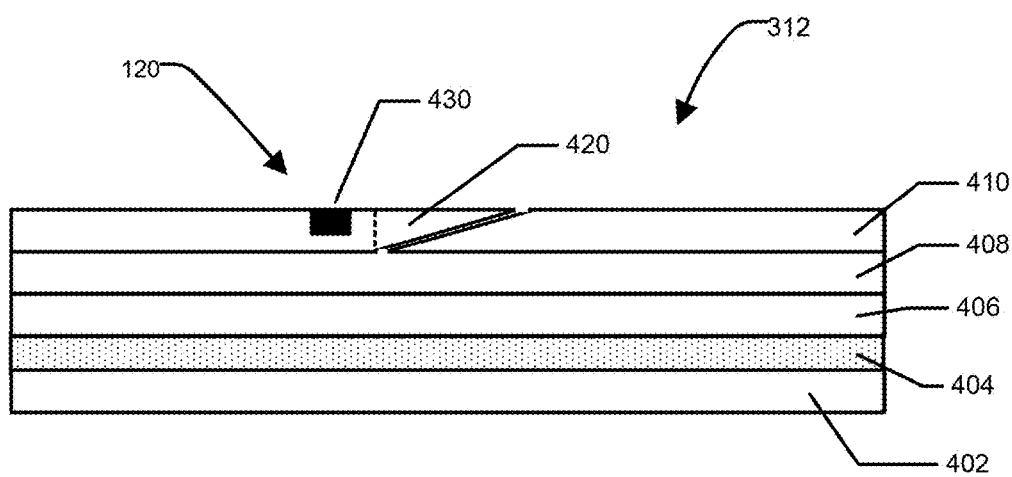
FIG. 7 is a cross sectional view of the enclosure bottom according to another embodiment of the present disclosure.
Figure 8:
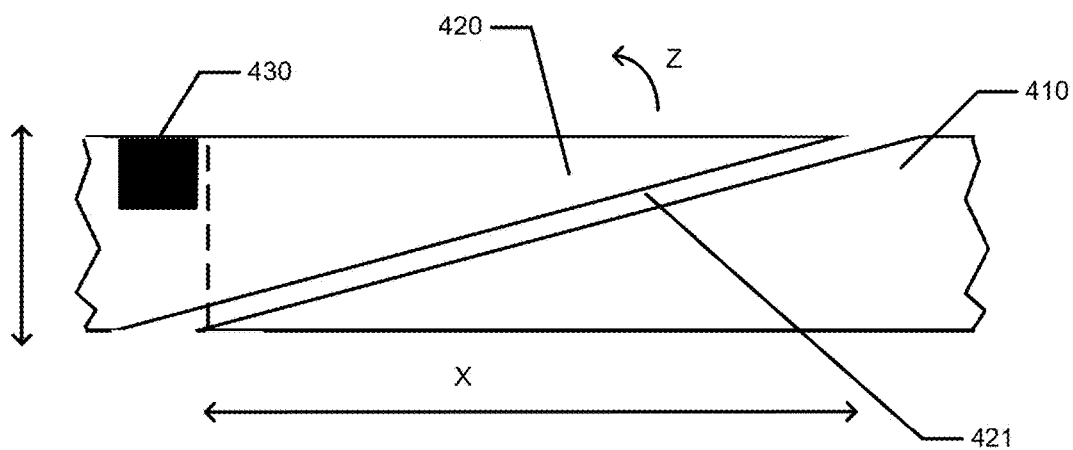
FIG. 8 is an enlarged view of the vibrating element shown in FIG. 7.

FIG. 7 is a cross sectional view of the enclosure bottom 310 along cross section reference 312, according to another embodiment of the present disclosure. FIG. 8 is a magnified view of the vibrating element shown at FIG. 7. The vibrating element 420 is similar to that described with reference to FIGS. 4-6 with one exception. In the embodiment of FIGS. 7 and 8, the portion of the opening defined by reference C and reference 421 is milled at an acute angle with respect to the top major surface of carbon fiber sheet 410 instead of perpendicular to the major surface as in FIGS. 5 and 6. The portion of opening 421 can extend all the way through sheet 410, or can extend only partially into sheet 410, thus terminating before piercing sheet 410, adjacent to sheet 408. The portion of the opening corresponding to references A and B can be perpendicular to the major surface of sheet 410, the same as described above in the first embodiment. Note that the plunging angle is not drawn to scale. For example, dimension X can be five millimeters and the thickness of sheet 410 can be 0.15 millimeters. In an embodiment, the opening corresponding to references A, B, and C can be provided after lamination and molding of sheets 402-410. Similar to described above, piezoelectric transducer 430 can be bonded proximate to the root end of vibrating element 420, as shown at FIGS. 7 and 8.

Figure 9:
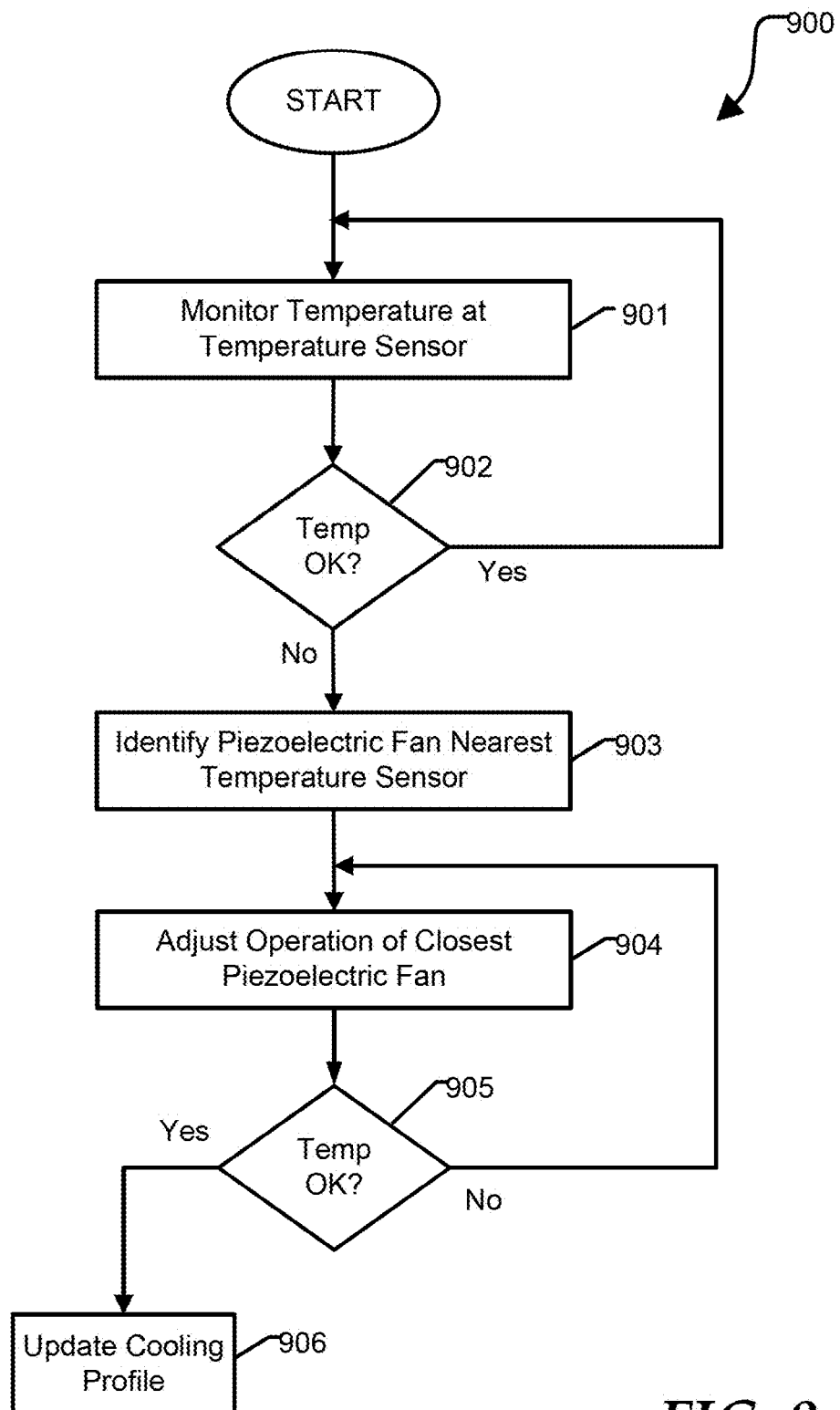
FIG. 9 is a flow diagram illustrating a method for controlling piezoelectric fans according to a specific embodiment of the present disclosure.

FIG. 9 shows a flow diagram illustrating a method 900 for controlling piezoelectric fans according to a specific embodiment of the present disclosure. Method 900 begins at block 901 where a temperature at a temperature sensor is monitored. For example, cooling controller 110 can routinely monitor one or more temperature sensors 130 included at information handling system 200. The method continues at decision block 902 where it is determined whether the temperature at the temperature sensor is below a designated limit. For example, if the temperature at a temperature sensor 130 is below a predetermined threshold, the method returns to block 901 where the monitoring of temperature sensors 130 continues. If the temperature at a sensor 130 exceeds the threshold, the method proceeds to block 903 where a piezoelectric fan 120 nearest to the sensor 130 is identified. The method continues at block 904 where operation of the identified fan is adjusted. For example, the identified piezoelectric fan 120 may initially be unpowered and cooling controller 110 can enable operation of the fan. Alternatively, the fan 120 may be operating at low power and cooling controller 110 can increase the operating power so that the fan provides additional cooling in the vicinity of the fan. One or more fans can be disabled or their operating power can be decreased if cooling is no longer needed at a particular portion of the system.

The method continues at decision block 905 where the cooling controller 110 once again monitors the temperature at the temperature sensor 130 to determine whether the excessive temperature situation has been remedied. If the temperature at the temperature sensor 130 still exceeds the threshold, the method returns to block 904 where further adjustments of the operation of the fan 120 can be made. However, if the temperature at the temperature sensor 130 no longer exceeds the threshold, the method can proceed to block 906 where the cooling profile 112 can be updated. The cooling profile 112 can include information describing the configuration of each of piezoelectric fans 120, temperature information from each of temperature sensors 130, vibration sensors 140, airflow sensors 142, and operating parameters 150, as described above. At another time, the cooling controller 110 can utilize the cooling profile and current operating parameters to initialize or configure operation of the piezoelectric fans 120. In an embodiment, the piezoelectric fans can include a carbon fiber vibrating elements 420 and an associated piezoelectric transducer 430, as described above with reference to FIGS. 4-8.

Figure 10:
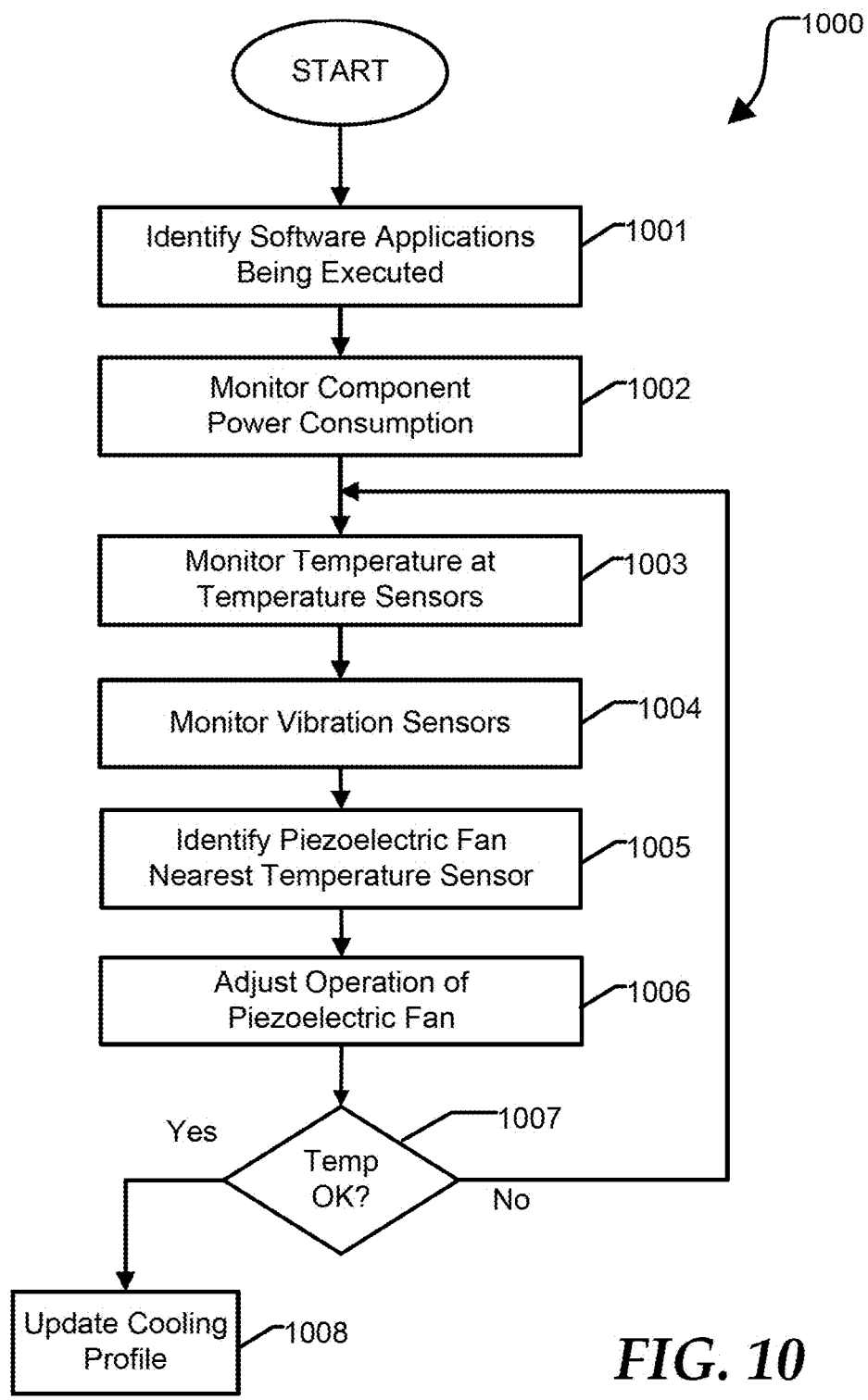
FIG. 10 shows a flow diagram illustrating a method for controlling piezoelectric fans according to another embodiment of the present disclosure.

FIG. 10 shows a flow diagram illustrating a method 1000 for controlling piezoelectric fans according to another embodiment of the present disclosure. Method 1000 begins at block 1001 where software applications that are executing at an information handling system are identified. For example, cooling controller 110 at information handling system 200 can determine the identity of programs presently in execution, such as a word processing application. The method continues at block 1002 where power consumption of system components can be monitored. For example, cooling controller 110 can monitor instantaneous or average power consumption at one or more components or subsystems included at information handling system 200, such as the CPU, graphics processor, peripheral devices, chipsets, and the like. The method continues at block 1003 where a temperature at each temperature sensor is monitored. For example, temperature sensors 130 can provide thermal information at a multiple locations within the system 200. The method continues at block 1004 where vibration information, if available, can be monitored. For example, the system 200 can include one or more vibration sensors. The vibration sensor can provide information indicative of the performance of a vibrating element 420, and can provide an indication of vibration conducted to an enclosure surface that may be felt by a user of the system 200.

The method continues at block 1005 where the location of piezoelectric fans, with respect to the location of the temperature and vibration sensors can be identified. For example, cooling controller can determine which piezoelectric fan is closest to a hot spot. The method continues at block 1006 where the operation of each piezoelectric fan can be adjusted. For example, each of piezoelectric fans 120 can be configured to an initial operating condition. The initial operating condition can be determined based on information stored at cooling profile 120. The method continues at decision block 1007 where it is determined whether a temperature at each temperature sensor exceeds a designated threshold. If one or more sensors indicate excessive heat, the method returns to block 1003 where adjustments can be refined. If the temperature at each sensor is acceptable, the method proceeds to block 1008 where the cooling profile can be updated. One of skill will appreciate that method 1000 has been simplified for clarity. For example, the process for adjusting the operation of each piezoelectric fan 120 can be iterative to increase, but also to decrease, the performance of each fan. If a particular portion of information handling system 200 is sufficiently cool, piezoelectric fans in that area can be disabled or throttled. Method 1000 can be performed continuously, updating fan operation and updating the cooling profile 112 to improve system efficiency, adjust for changing circumstances, or to optimize other characteristics. In an embodiment, the cooling profile 112 can take into account information provided in a configuration file. For example, a user can configure the operation of information handling system 200 and cooling system 112 to optimize computational performance, to increase battery life, to minimize sound or vibration, and the like.

Figure 11:
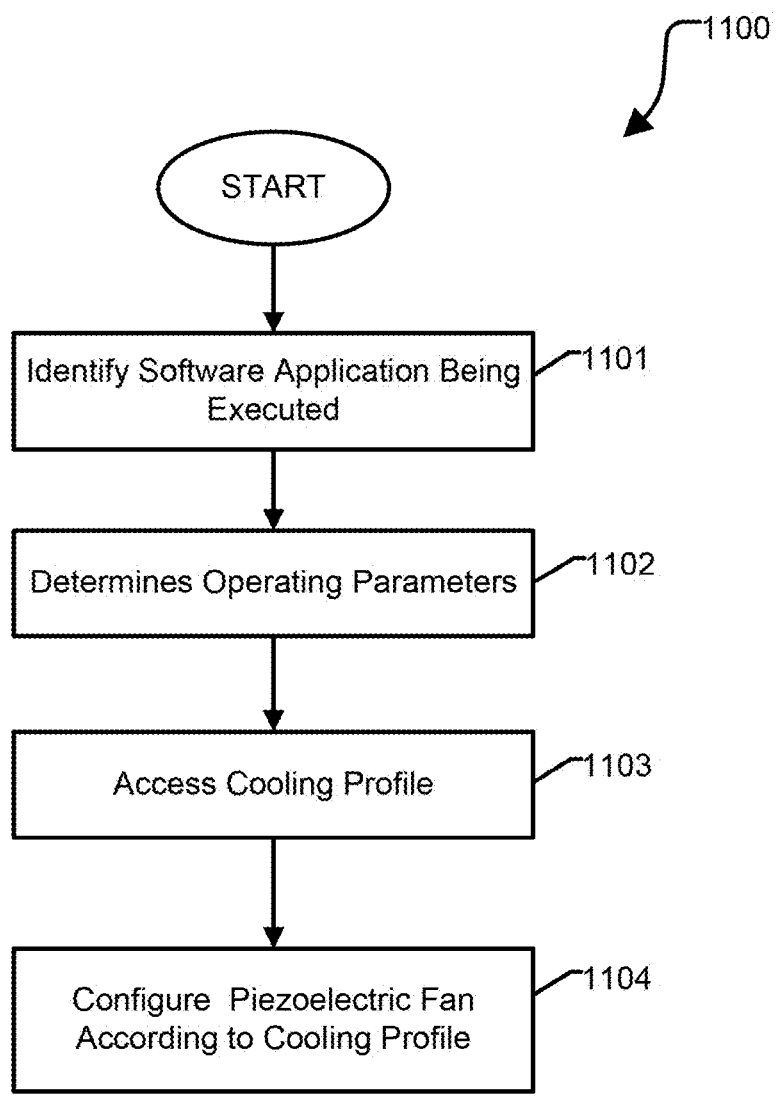
FIG. 11 is a flow diagram illustrating a method for initializing operation of a distributed piezoelectric cooling system according to yet another embodiment of the present disclosure.

FIG. 11 shows a flow diagram illustrating a method 1100 for initializing operation of a distributed piezoelectric cooling system according to yet another embodiment of the present disclosure. Method 1100 begins at block 1101 where the cooling controller 110 identifies software applications presently being executed at the information handling system 200. The method continues at block 1102 where the controller 110 determines the present state of operating parameters at system 200. As described above, the operating parameters can include a measurement, characteristic, or other variable that can affect the operation of system 200, from a thermal perspective. The method continues at block 1103 where the cooling profile 112 can be accessed. The collection of acquired system information can be used to determine an appropriate configuration of each piezoelectric fan. For example, the cooling profile can include a multidimensional lookup table or mathematical algorithm that correlates operating information and parameters with the operation of each piezoelectric fan 120.

Figure 12:
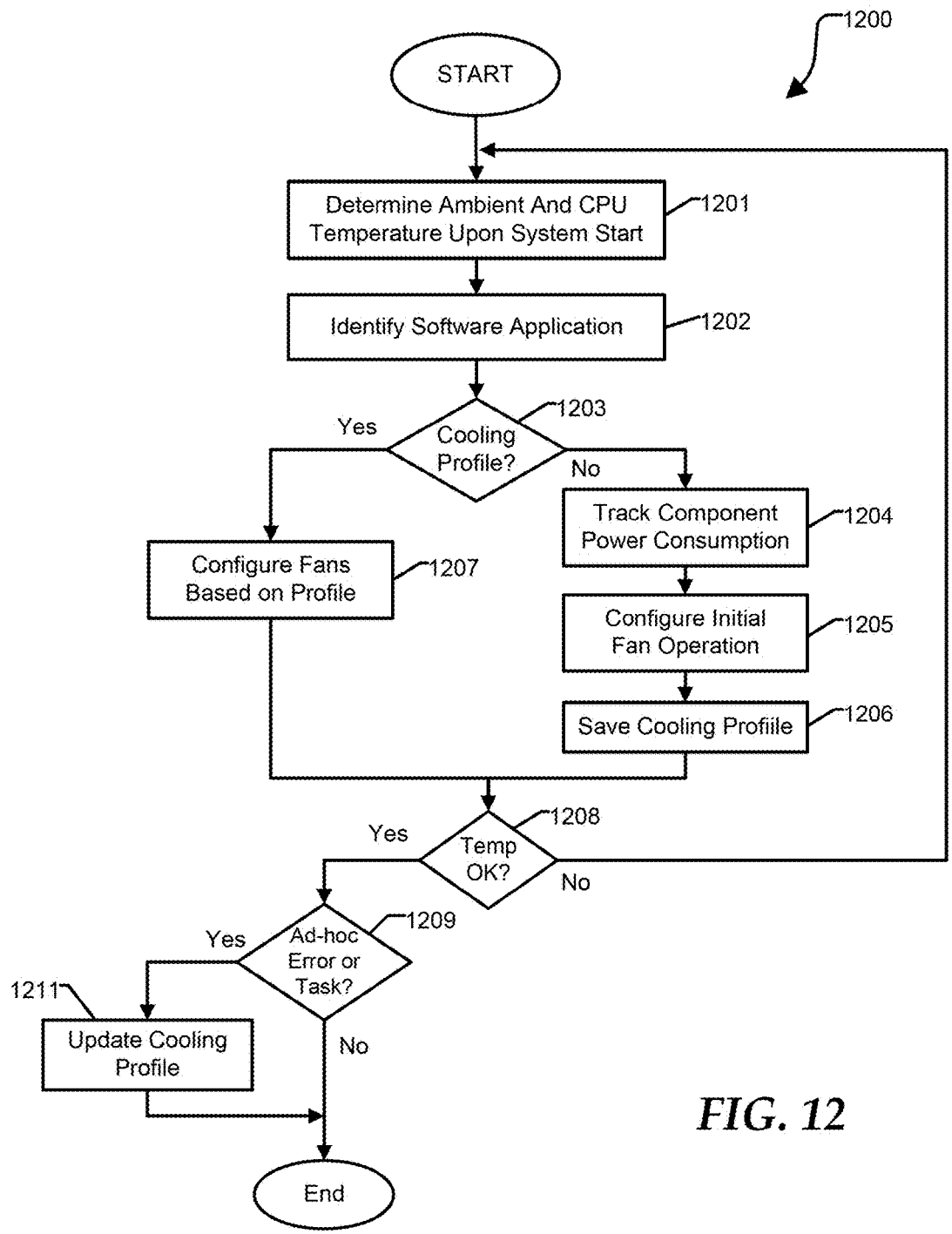
FIG. 12 shows a flow diagram illustrating a method for administering a distributed piezoelectric cooling system according to still another embodiment of the present disclosure.

FIG. 12 shows a flow diagram illustrating a method 1200 for administering a distributed piezoelectric cooling system according to still another embodiment of the present disclosure. Method 1200 illustrates the versatility of cooling controller 110 and cooling profile 112. The method begins at block 1201 where the cooling controller 110 can determine an ambient temperature of information handling system 200 and/or a temperature of a CPU upon system start. The method continues at block 1202 where the cooling controller monitors software applications and software processes presently active at the system. The method continues at decision block 1203 where the cooling controller 110 determines whether cooling profile 112 has been generated, and if so, whether the cooling profile includes fan configuration information corresponding to the temperature and application information determined at blocks 1201 and 1202. If configuration information matching the present operating conditions is not present at cooling profile 112, the method continues at block 1204 where power consumption at selected system components can be tracked. The method continues at block 1205 where an initial operating configuration for piezoelectric fans 120 is selected. The method continues at block 1206 where the system characteristics and fan configuration are saved at the cooling profile 112.

Returning to decision block 1203, if configuration information matching the present operating conditions is present at cooling profile 112, the method continues at block 1207 where operation of piezoelectric fans 120 can be configured based on the system characteristics and fan configuration information saved at the cooling profile 112. The method continues from block 1206 or 1207 to decision block 1208, where the cooling controller 110 monitors temperature sensors 130 to determine whether the temperature at any portion of information handling system exceeds specified levels. If cooling is found inadequate, the method returns to block 1201 where the iterative learning process to can be continued and the cooling profile 112 can be updated. If cooling is found adequate, the method continues to decision block 1209, where cooling controller 110 can determine whether an ad-hoc error or task is detected. For example, cooling controller 110 can monitor temperature sensors 120, vibrations sensors 140, airflow sensors 142, and operating parameters 150, the operating parameters including the identity of software applications presently being executed at system 200. If at any time, the set of operational information is inconsistent with information specified at cooling profile 112, cooling system 110 can determine that there may be an error of some kind at system 200.

Examples of an ad-hoc error can include dust accumulation at one or more piezoelectric fans, input vents, or exhaust vents, a circuit malfunction or fan malfunction, a mischaracterization of one or more software applications, and the like. If an ad-hoc error or other irregularity is detected, the method can proceed to block 1211 where the cooling profile 112 can be updated. For example, cooling system 110 can determine that increasing the operating power of a particular piezoelectric fan is sufficient to overcome the irregularity, and the cooling profile 112 can be updated to reflect the new configuration. If the error can not be addressed, an error message can be generated. For example, the cooling system 110 can generate an on-screen message to a user that cleaning or other maintenance of system 200 is advised.

Figure 13:
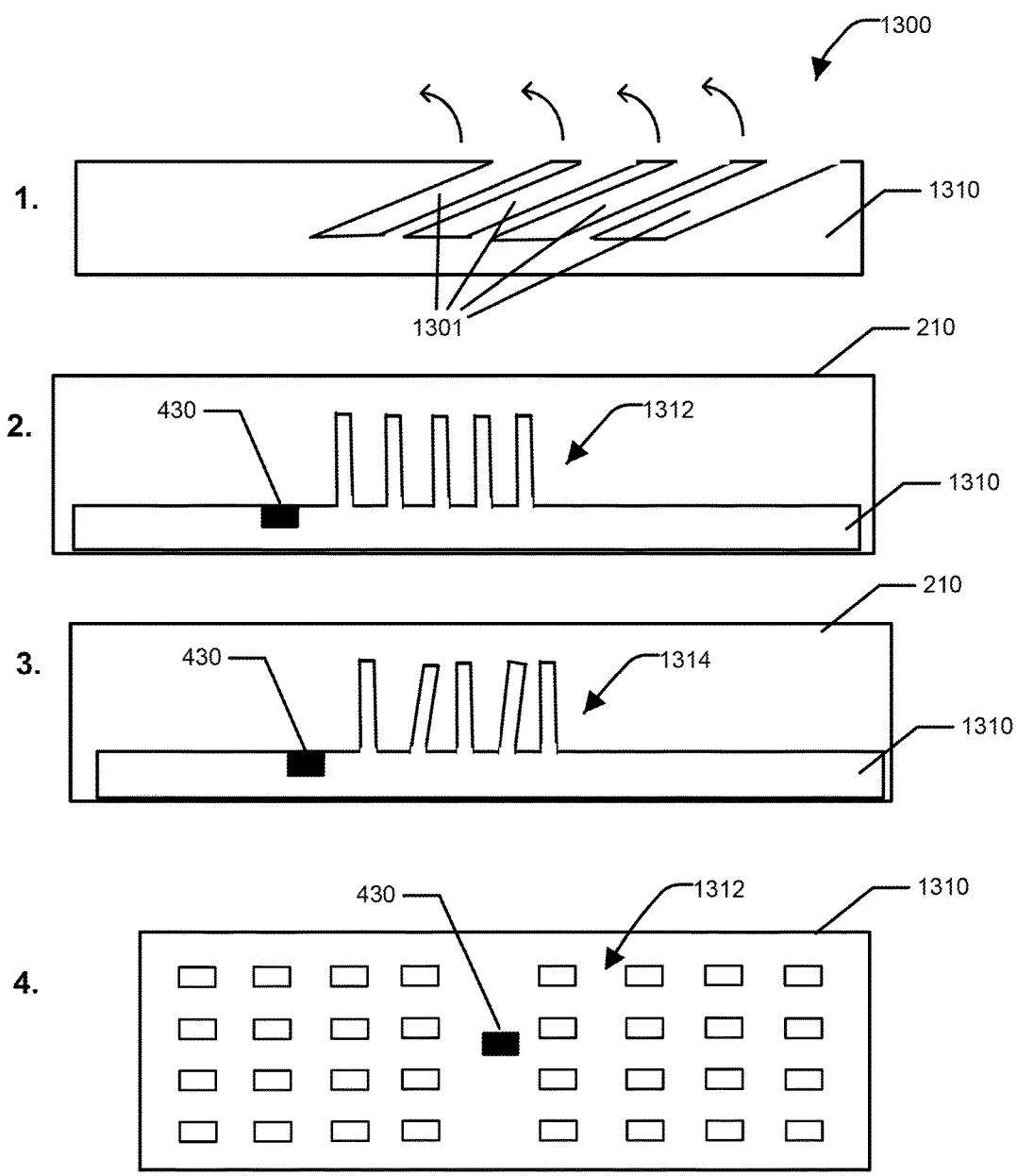
FIG. 13 illustrates techniques for fabricating a piezoelectric cooling device according to a specific embodiment of the present disclosure.

FIG. 13 illustrates techniques for fabricating a piezoelectric cooling device 1300 according to a specific embodiment of the present disclosure. The cooling device 1300 can be adapted to provide fins of a heat sink, fins at an intake or exhaust vent, such as vent 210 of FIG. 2. At drawing 1, openings 1301 can be milled into material 1310. The material 1310 can include aluminum, aluminum bonded with carbon fiber, carbon fiber, another metal, or combination of metal and a composite material. The openings 1301 do not fully penetrate the material 1310. The material remaining between the openings can be pulled, bent or otherwise manipulated, as indicated by the curved arrows, so that the remaining material form fins 1312 that are perpendicular to a major surface of material 1300, as shown at drawing 2. Alternatively, a subset of the fins 1314 can be oriented at an angle that is less than perpendicular, as shown at drawing 3. Drawings 2 and 3 illustrate the fin assembly incorporated at a vent, such as vent 210. A piezoelectric transducer 430 is bonded to the material 1310. While drawing 1 illustrates one technique for fabricating fins 1312 and 1314, other fabrication methods can be applied without deviating from the scope of the present disclosure. For, example, fins 1312 and 1314 can be fabricated from one or more layers of carbon fiber material using a molding process, or the like. Fins can be provided in a linear row, as illustrated in drawing 3, or can be provided in a two dimensional array including more than one row, as illustrated in drawing 4.

During operation, an oscillating signal is applied to the transducer 430, causing the transducer to vibrate and inducing fins 1312 or 1314 to vibrate in sympathy with transducer 430. The non-parallel fins 1314 at drawing 3 can stimulate increased air flow relative to the parallel fins 1312 by creating localized regions of non-uniform air pressure. As described above, cooling controller 110 can configure operation of transducer 430 to provide optimal air flow, based on information provided by temperature sensors, vibrations sensors, or based on information provided by the cooling profile 112.

Figure 14:
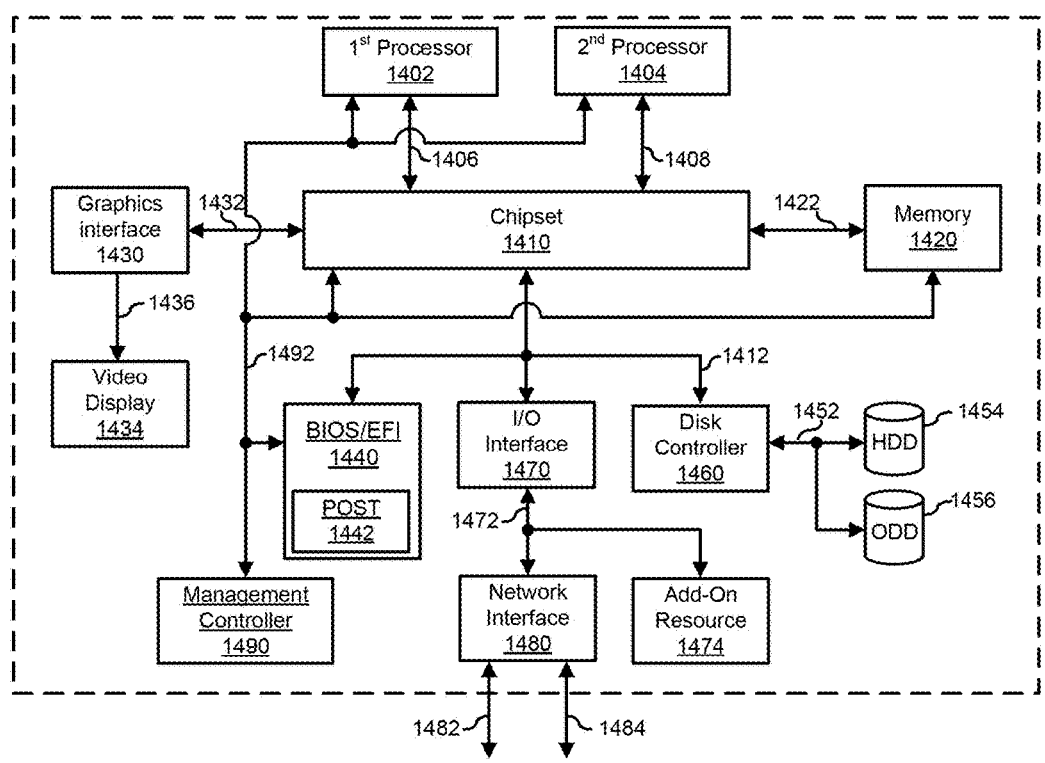
FIG. 14 is a block diagram of an information handling system according to an embodiment of the present disclosure.

FIG. 14 illustrates a generalized information handling system 1400 that can be utilized to carry the methods and to instantiate the devices and modules as described herein. As such, information handling system 1400 can include one or more computer-readable storage mediums that include machine-executable code for performing the methods or that are operated on by the devices and modules for carrying out the operations of the devices and modules described herein. Information handling system 1400 includes a processor 1402 and one or more additional processors 1404, a chipset 1410, a memory 1420, a graphics interface 1430, include a basic input and output system/extensible firmware interface (BIOS/EFI) module 1440, a disk controller 1450, a disk emulator 1460, an input/output (I/O) interface 1470, a network interface 1480, and a management controller (MC) 1490. Processor 1402 is connected to chipset 1410 via processor interface 1406, and processor 1404 is connected to the chipset via processor interface 1408. Memory 1420 is connected to chipset 1410 via a memory bus 1422. Graphics interface 1430 is connected to chipset 1410 via a graphics interface 1432, and provides a video display output 1436 to a video display 1434. In a particular embodiment, information handling system 1400 includes separate memories that are dedicated to each of processors 1402 and 1404 via separate memory interfaces. An example of memory 1420 includes random access memory (RAM) such as static RAM (SRAM), dynamic RAM (DRAM), non-volatile RAM (NV-RAM), or the like, read only memory (ROM), another type of memory, or a combination thereof.

BIOS/EFI module 1440, disk controller 1450, and I/O interface 1470 are connected to chipset 1410 via an I/O channel 1412. An example of I/O channel 1412 includes a Peripheral Component Interconnect (PCI) interface, a PCI-Extended (PCI-X) interface, a high-speed PCI-Express (PCIe) interface, another industry standard or proprietary communication interface, or a combination thereof. Chipset 1410 can also include one or more other I/O interfaces, including an Industry Standard Architecture (ISA) interface, a Small Computer Serial Interface (SCSI) interface, an Inter-Integrated Circuit (I²C) interface, a System Packet Interface (SPI), a Universal Serial Bus (USB), another interface, or a combination thereof. BIOS/EFI module 1440 includes BIOS/EFI code operable to detect resources within information handling system 1400, to provide drivers for the resources, initialize the resources, and access the resources. BIOS/EFI module 1440 includes code that operates to detect resources within information handling system 1400, to provide drivers for the resources, to initialize the resources, and to access the resources.

Disk controller 1450 includes a disk interface 1452 that connects the disc controller to a hard disk drive (HDD) 1454, to an optical disk drive (ODD) 1456, and to disk emulator 1460. An example of disk interface 1452 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof.

I/O interface 1470 includes a peripheral interface 1472 that connects the I/O interface to an add-on resource 1474 and to network interface 1480. Peripheral interface 1472 can be the same type of interface as I/O channel 1412, or can be a different type of interface. As such, I/O interface 1470 extends the capacity of I/O channel 1412 when peripheral interface 1472 and the I/O channel are of the same type, and the I/O interface translates information from a format suitable to the I/O channel to a format suitable to the peripheral channel 1472 when they are of a different type. Add-on resource 1474 can include a data storage system, an additional graphics interface, a network interface card (NIC), a sound/video processing card, another add-on resource, or a combination thereof. Add-on resource 1474 can be on a main circuit board, on separate circuit board or add-in card disposed within information handling system 1400, a device that is external to the information handling system, or a combination thereof.

Network interface 1480 represents a NIC disposed within information handling system 1400, on a main circuit board of the information handling system, integrated onto another component such as chipset 1410, in another suitable location, or a combination thereof. Network interface device 1480 includes network channels 1482 and 1484 that provide interfaces to devices that are external to information handling system 1400. In a particular embodiment, network channels 1482 and 1484 are of a different type than peripheral channel 1472 and network interface 1480 translates information from a format suitable to the peripheral channel to a format suitable to external devices. An example of network channels 1482 and 1484 includes InfiniBand channels, Fibre Channel channels, Gb Ethernet channels, proprietary channel architectures, or a combination thereof. Network channels 1482 and 1484 can be coupled to external network resources (not illustrated). The network resource can include another information handling system, a data storage system, another network, a grid management system, another suitable resource, or a combination thereof.

MC 1490 is connected to processors 1402 and 1404, chipset 1410, memory 1420, and BIOS/EFI module 1440 via a system communication bus 1492. MC 1490 may be on a main circuit board (e.g., a baseboard, a motherboard, or a combination thereof), integrated onto another component such as chipset 1410, in another suitable location, or a combination thereof. In a particular embodiment, one or more additional resources of information handling system 1400, such as graphics interface 1430, video display 1434, I/O interface 1470, disk controller 1450, and network interface 1480 are connected to MC 1490. MC 1490 can be part of an integrated circuit or a chip set within information handling system 1400, and can be on a main circuit board, on separate circuit board or add-in card disposed within the information handling system, or a combination thereof. An example of MC 1490 includes a baseboard management controller (BMC), an integrated Dell remote access controller (iDRAC), another controller, or a combination thereof. An example of system communication bus 1492 includes an inter-integrated circuit ($I^2C$) bus, a system management bus (SMBus), a serial peripheral interface (SPI) bus, a low pin count (LPC) bus, another bus, or a combination thereof.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

In the embodiments described herein, an information handling system includes any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system can be a personal computer, a consumer electronic device, a network server or storage device, a switch router, wireless router, or other network communication device, a network connected device (cellular telephone, tablet device, etc.), or any other suitable device, and can vary in size, shape, performance, price, and functionality.

The information handling system can include memory (volatile (e.g. random-access memory, etc.), nonvolatile (read-only memory, flash memory etc.) or any combination thereof), one or more processing resources, such as a central processing unit (CPU), a graphics processing unit (GPU), hardware or software control logic, or any combination thereof. Additional components of the information handling system can include one or more storage devices, one or more communications ports for communicating with external devices, as well as, various input and output (I/O) devices, such as a keyboard, a mouse, a video/graphic display, or any combination thereof. The information handling system can also include one or more buses operable to transmit communications between the various hardware components. Portions of an information handling system may themselves be considered information handling systems.

When referred to as a "device," a "module," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device).

The device or module can include software, including firmware embedded at a device, such as a Pentium class or PowerPC™ brand processor, or other such device, or software capable of operating a relevant environment of the information handling system. The device or module can also include a combination of the foregoing examples of hardware or software. Note that an information handling system can include an integrated circuit or a board-level product having portions thereof that can also be any combination of hardware and software.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. An apparatus comprising:
   an array of fins, each fin formed at a surface of a heat conducting material, at least three sides of each fin defined by a machined opening extending into a major surface of the material, a base of each fin remaining rooted in the material; and
   a piezoelectric transducer bonded to the heat conducting material adjacent to the array of fins, the fins to vibrate in response to and in sympathy with vibration of the piezoelectric transducer, vibration of the transducer in response to being energized by a signal having a first frequency.

2. The apparatus of claim 1, wherein:
   the opening descends at an acute angle relative to the first major surface of the heat conducting material; and
   the fin defined by the opening is manipulated during manufacture in a direction that is perpendicular to the major surface.

3. The apparatus of claim 2, wherein a first fin of the array of fins is manipulated to be perpendicular to the major surface of the heat conducting material, and a second fin of the array adjacent to the first fin is manipulated to be less than perpendicular to the major surface.

4. The apparatus of claim 3, wherein the first and second fins being non-parallel stimulate air flow by creating localized regions of non-uniform air pressure.

5. The apparatus of claim 1, further comprising:
   a controller including a signal generator coupled to the piezoelectric element, the controller to control the piezoelectric transducer to excite sympathetic vibration of each fin of the array.

6. The apparatus of claim 1, further comprising:
   an airflow sensor; and
   a controller coupled to the piezoelectric transducer, the controller to regulate operation of the piezoelectric transducer based on information provided by the airflow sensor.

7. The apparatus of claim 1, further comprising:
   a memory device to store a cooling profile associating an operating configuration of the piezoelectric transducer with a first application program executing at the information handling system; and
   a controller coupled to the piezoelectric transducer and to the memory device, the controller to regulate operation of the piezoelectric transducer based on the cooling profile.

8. The apparatus of claim 1, wherein the heat conducting material is a carbon fiber composite.

9. The apparatus of claim 1, wherein the piezoelectric transducer is a discrete component in proximity to the array of fins and not in intimate contact with any fin of the array of fins.

10. The apparatus of claim 1, wherein the heat conducting material is aluminum bonded to a carbon fiber composite.

11. The apparatus of claim 1, wherein the array of fins extend in one direction parallel with the major surface of the heat conducting material.

12. The apparatus of claim 1, wherein fins of the array of fins extend in two directions parallel with the major surface of the heat conducting material.

13. A method comprising:
   machining openings at a heat conducting material to define at least three side portions of each fin of an array of fins, the openings extending into a major surface of the material, a base of each fin remaining rooted in the material;
   providing a piezoelectric transducer bonded to the heat conducting material, the transducer adjacent to the array of fins, the piezoelectric transducer being a discrete component that is not in intimate contact with any fin of the array of fins; and
   providing a controller including a signal generator coupled to the piezoelectric transducer, a signal provided by the signal generator causing the piezoelectric transducer to vibrate and excite sympathetic vibration of each fin.

14. The method of claim 13, further comprising:
   manipulating a first fin of the array to be perpendicular to the major surface of the heat conducting material; and
   manipulating a second fin of the array adjacent to the first fin to be less than perpendicular to the major surface, wherein the first and second fins being non-parallel stimulate air flow by creating localized regions of non-uniform air pressure.

15. The method of claim 13, wherein the controller is further configured to regulate operation of the piezoelectric transducer based on vibration information provided by a vibration sensor located adjacent to the array of fins.

16. The method of claim 13, wherein the controller is further configured to regulate operation of the piezoelectric transducer based on a cooling profile associating an operating configuration of the piezoelectric transducer with a first application program executing at an information handling system including the array of fins.

17. The method of claim 13, wherein the array of fins is included at an exhaust vent of an information handling system.

18. The method of claim 13, wherein the array of fins is included at an intake vent of an information handling system.

19. The method of claim 13, wherein the array of fins are included at a heat sink coupled to a heat generating component at an information handling system.

20. An information handling system comprising:
an array of fins, each fin formed at a surface of a heat conducting material, at least three sides of each fin defined by a machined opening extending into a major surface of the material, a base of each fin remaining rooted in the material; and
a piezoelectric transducer bonded to the heat conducting material adjacent to the array of fins, the fins to vibrate in response to and in sympathy with the piezoelectric transducer when the transducer is energized by a signal having a first frequency, wherein the piezoelectric transducer is not in intimate contact with any fin of the array of fins.

* * * * *